(12) United States Patent
Low et al.

(10) Patent No.: US 8,008,119 B2
(45) Date of Patent: Aug. 30, 2011

(54) SURFACE MOUNT OPTOELECTRONIC COMPONENT WITH LENS HAVING PROTRUDING STRUCTURE

(76) Inventors: Tek Beng Low, Melaka (MY); Kheng Chiong Tay, Melaka (MY)

( * ) Notice: Subject to any disclaimer, the term of this patent is extended or adjusted under 35 U.S.C. 154(b) by 0 days.

(21) Appl. No.: 12/692,814

(22) Filed: Jan. 25, 2010

(65) Prior Publication Data
US 2010/0187703 A1 Jul. 29, 2010

Related U.S. Application Data

(62) Division of application No. 11/512,370, filed on Aug. 30, 2006, now Pat. No. 7,675,081.

(30) Foreign Application Priority Data
Sep. 1, 2005 (MY) ................ PI 20054103

(51) Int. Cl.
*H01L 21/00* (2006.01)

(52) U.S. Cl. .......................... 438/106; 257/98
(58) Field of Classification Search .............. 257/99
See application file for complete search history.

(56) References Cited

U.S. PATENT DOCUMENTS

| | | | | |
|---|---|---|---|---|
| 5,034,347 A | * | 7/1991 | Kakihana | 438/667 |
| 6,610,563 B1 | * | 8/2003 | Waitl et al. | 438/166 |
| 7,279,346 B2 | * | 10/2007 | Andrews et al. | 438/27 |
| 7,326,583 B2 | * | 2/2008 | Andrews et al. | 438/26 |
| 2003/0185526 A1 | | 10/2003 | Höhn et al. | |
| 2005/0018977 A1 | * | 1/2005 | Beer et al. | 385/88 |
| 2005/0121820 A1 | | 6/2005 | Rolston et al. | |
| 2005/0242056 A1 | | 11/2005 | Ho et al. | |

* cited by examiner

*Primary Examiner* — Thao P. Le
(74) *Attorney, Agent, or Firm* — Finnegan, Henderson, Farabow, Garrett & Dunner, L.L.P.

(57) ABSTRACT

The invention relates to a surface mount optoelectronic component with a lens attachment, the method for precising the lens position and the method to manufacture the whole component.

3 Claims, 3 Drawing Sheets

SURFACE MOUNT OPTOELECTRONIC COMPONENT WITH LENS HAVING PROTRUDING STRUCTURE

This is a divisional of application Ser. No. 11/512,370, filed Aug. 30, 2006 now U.S. Pat. No. 7,675,081, which is based upon and claims the benefit of priority under 35 U.S.C. §119 from Malaysian patent application No. PI 20054103 filed on Sep. 1, 2005, the contents of both of which are incorporated herein by reference.

FIELD OF INVENTION

The invention relates to a surface mount optoelectronic component with a lens attachment, the method for precising the lens position and the method to manufacture the whole component.

PRIOR ART

Similar component has been described by many prior arts. Waitl et. al. has described in U.S. Pat. No. 6,610,563 a surface mount component where an optical device is placed onto a base body. According to the patent, a base component with a semiconductor chip mounted in a recess is filled with a casting compound. An optical device is then placed on top of the base component so whereby the optical device comes into contact with the casting compound; before the casting compound is cured. The whole assembly is then cured to achieve adhesion between the base component and the optical device.

This approach has the disadvantages that precise location of the optical device is difficult because the optical device may move in the time when it is cured with the base component.

In another disclosure by Hohn et. al. in US patent US2003/0185526A1, an optical lens is secured over an optoelectronic component by means of a UV-initiated or photoinitiated, cationically curing epoxy resin. According to the description, the invention has the advantage of rapid fixation of the optical lens and thus improve the precision of bonding.

SUMMARY OF INVENTION

According to one aspect of the present invention, there is provided an optoelectronic component assembly based on surface mount technology comprising:
an electrically conductive material which is used to serve as a base component for the assembly,
an opaque material which is used to provide a housing for the whole component assembly;
a cavity designed within the electrically conductive material where at least one optoelectronic chip is mounted within,
file cavity being filled with an encapsulation material so that optical radiation may be transmitted or received via this material,
a lens structure which is attached to the housing and which is located by a groove on the housing and a protruding structure on the lens.

The opaque material used to provide the housing may be made from plastic.

Multiple, instead of one, optoelectronic chips may be mounted within the cavity.

Electrical connection(s) between the optoelectronic chip(s) and the base component for the assembly may be provided by a metallic wire.

The groove may be formed around the cavity and used to position the lens structure onto the base component.

Another preferred embodiment of the invention is where the encapsulation material is silicone material.

Preferably, the silicone material has a hardness (Type A) of less than 85 after being cured and hardened.

Another preferred embodiment of the invention is where the lens structure is made from silicone.

It is also one of the preferred embodiments of the invention for silicone to be used as a bonding material between the lens structure and the base component.

One of the more preferred embodiments of the invention is where the encapsulation material, the lens structure and the bonding material between the lens structure and the base component are silicone material.

It is recommended that the base and groove have a rough surface texture to promote better adhesion of the lens structure to the base component.

According to another aspect of the present invention, there is also provided a method for producing a surface mount optoelectronic component assembly, said method comprising the steps:
preparing the base component with one or more optoelectronic chip(s) mounted within the cavity,
filling the cavity with an encapsulation material,
curing the base component to harden the encapsulation material,
applying an amount of the same encapsulation material on the top of the base component;
placing the lens structure on top and located by the groove,
then curing the whole assembly to bond the lens and base component together.

In the aforesaid method, heat may be used to cure the final assembly so that the lens is bonded to the base component.

In the method, silicone may be used as the bonding material between the lens and the base component.

According to yet another aspect of the present invention, there is provided a method for producing a lens structure for a surface mount optoelectronic assembly using silicone as a base material, comprising the steps:
mold tool is fabricated with the required lens profile,
liquid silicone is dispensed into the tool,
the tool is heated so that the silicone is cured and hardened to form the lens structure before being removed from the tool.

In any of the embodiments of the method of producing the surface mount optoelectronic component assembly of the present invention, the encapsulation material used may be silicone.

The lens structure used in the method may also be made from silicone.

The optoelectronic component assembly of the present invention is also designed to be more robust when used in the environment especially when exposed to UV (ultraviolet) radiation.

For a better understanding of the invention and to show how it can be carried out into effect, some preferred embodiments thereof will now be described by way of non-limiting examples, and where necessary with reference to the accompanying drawings.

DETAILED DESCRIPTION OF SOME PREFERRED EMBODIMENTS

Figure 1:
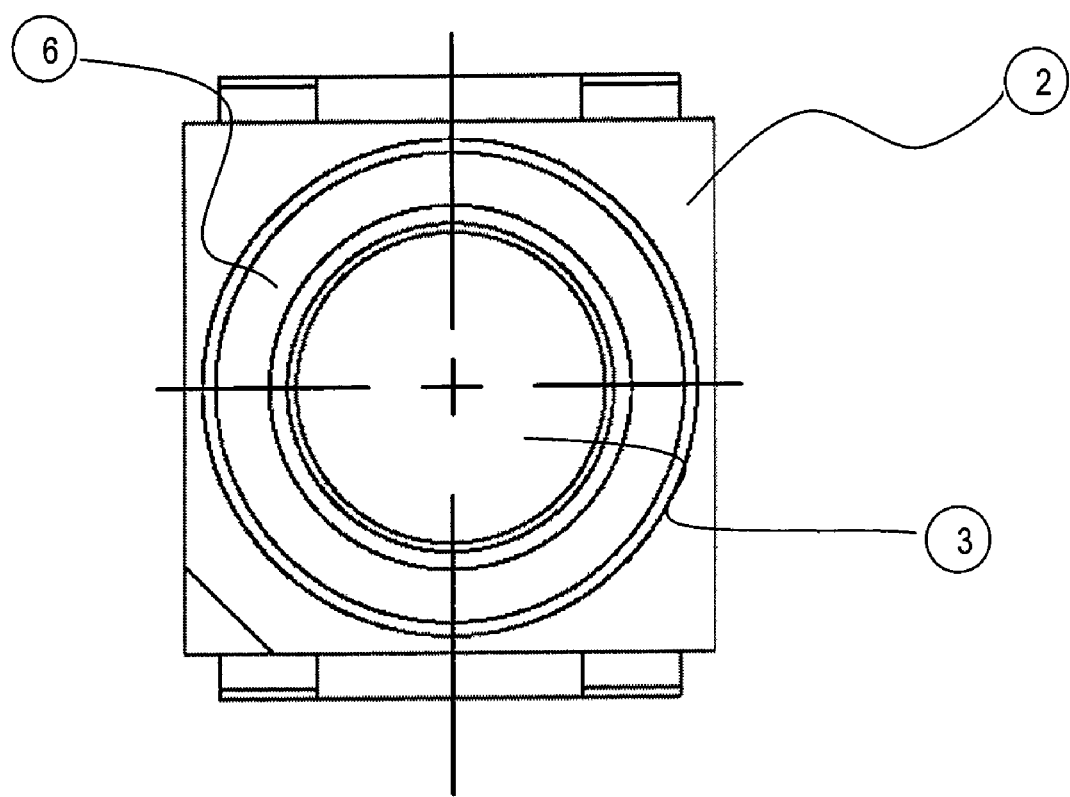
FIG. 1 is a top view of the base component of an optoelectronic component assembly.

In an embodiment of the present invention, the optoelectronic component based on the surface mount technology is made up of a thick electrically conductive material which is used to serve as the base for the assembly, an opaque plastic material which is used to provide the housing for the whole component and a cavity designed within the plastic material where an optoelectronic chip is mounted within. Multiple chips may also be mounted if required. This cavity is filled with a encapsulation material so that optical radiation may be transmitted or received via this material. Electrical connection(s) between the chip/chips and the base material is provided by a metallic wire.

The housing of the base component is designed in such a way whereby a groove is formed around the cavity. This groove is used to position the lens which is attached onto the base component. On the lens itself, a protruding structure is made to locate into the groove found on the base component. The arrangement ensures a precise fitting of the lens with reference to the base component.

In an embodiment, the steps for the manufacture of the component comprise of the following. The base component is assembled with the optoelectronic chip and electrical connections are made. The cavity then filled with the encapsulation material so that the whole cavity is completely filled. The base component is then cured to that the encapsulation material is hardened.

In an embodiment, the same encapsulation material is dispensed onto the top of the base component. Following that, the lens is placed on top such that the encapsulation material forms a layer in between the lens and the base component. Sufficient encapsulation material is necessary to ensure that the encapsulation material spreads all over the top of the base component till the extend that it flows into the groove and fills the groove. The component is then cured by heat so that the layer in between hardens and bonds the lens onto the base component. The bonding is superior compared to prior arts due to the larger surface area provided by the groove. In addition, the rough surface texture of the base component further promotes adhesion.

In an embodiment, the preferred encapsulation system is based on silicone. Liquid silicone is dispensed into the cavity of the base component and is cured with heat. The same silicone material is used to make the lens structure. Mold tools are fabricated with the required lens profile and liquid silicone is dispersed into the tools and cured with heat so that it hardens before being removed front the tools. The same silicone material is also used for the bonding purpose. This common material used to fill the cavity, make the lens and also for bonding ensures a good match in terms of thermal coefficient of expansion (CTE). The ensures that the adhesion between the parts is reliable and is not prone to cracks along the bonding interface due to CTE mismatch.

The silicone material also ensures robust reliability when the component is exposed to the UV (ultraviolet) exposure in the environment compared to epoxy resins which are described by the prior arts. In addition, the preferred silicone material have a hardness (Type A) of less than 85 after being cured and hardened. This soft characteristic of the silicone material ensures minimum mechanical stress to the optoelectronic chip mounted within. Consequently, the component demonstrates more superior lifetime performance compared to prior arts employing epoxy resin systems.

Figures 2A, 2B:
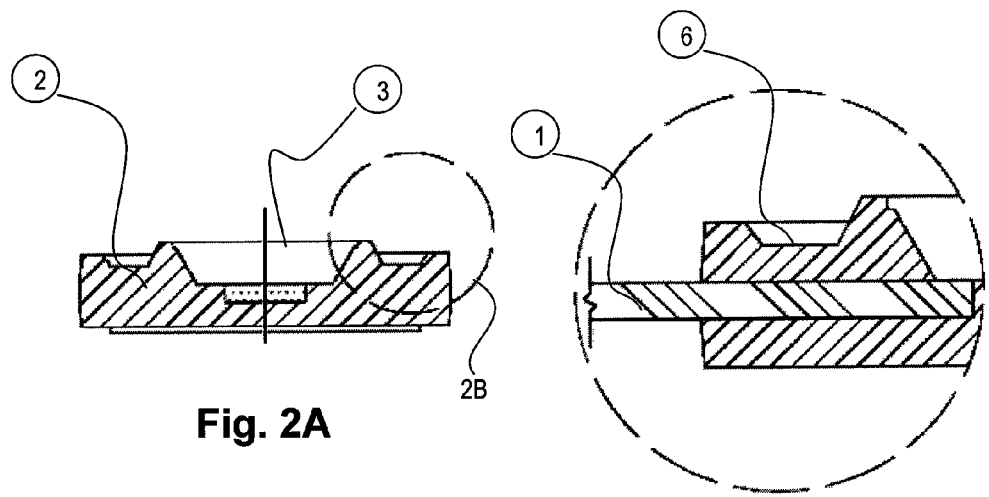
FIG. 2A is a cross sectional view of the base component shown in FIG. 1.
FIG. 2B is a blown up view of a portion of the base component generally corresponding with the portion labeled 2B in FIG. 2A, and includes an enlarged view of the locating groove.
Figure 3:
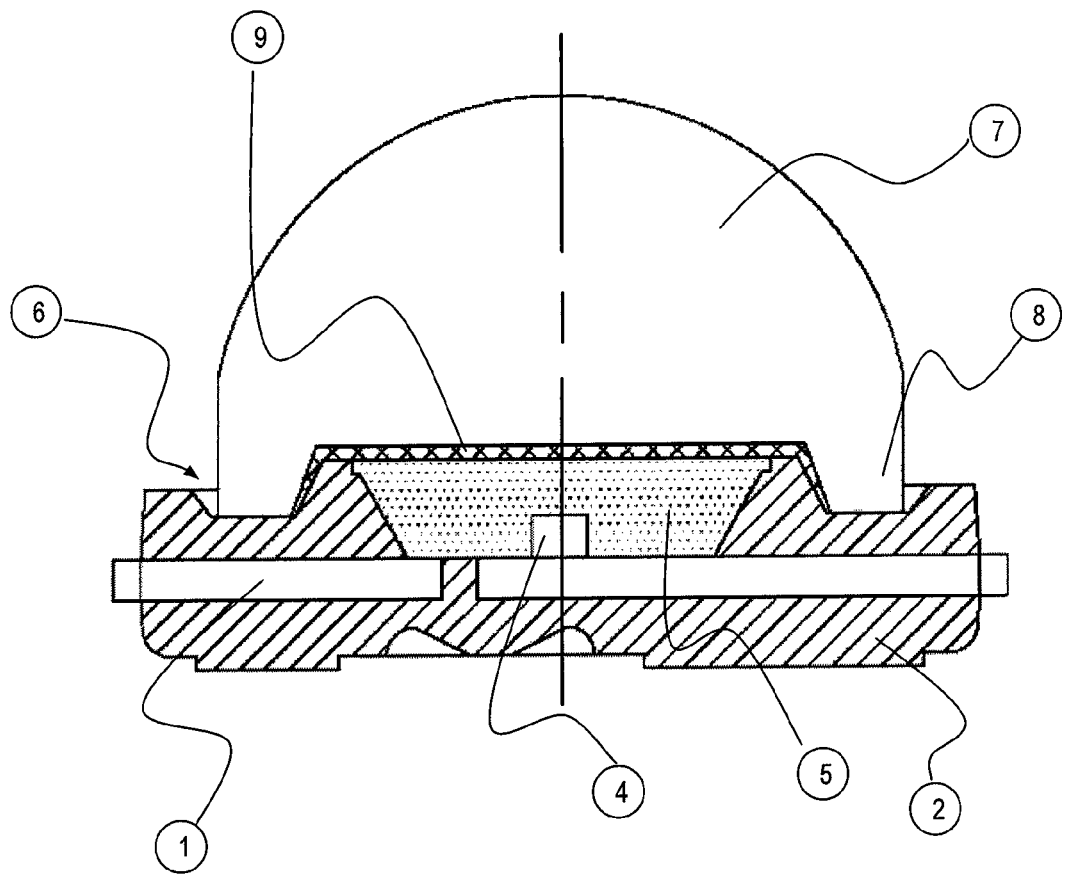
FIG. 3 is a cross sectional view of the invention after the lens is attached.

FIGS. 1-3 show a preferred embodiment of the present invention. The invention includes a base component made up of a thick electrically conductive material (1) which is used to serve as the base for the assembly, an opaque plastic material (2) which is used to provide the housing for the whole component and a cavity (3) designed within the plastic material where an optoelectronic chip (4) is mounted within. This cavity is filled with a encapsulation material (5) so that optical radiation may be transmitted or received via this window. Electrical connection(s) between the chip and the base material is provided by a metallic wire.

A circular groove (6) is located around the cavity. A lens structure (7) is placed on top of the base component. The lens position is precisely located due the groove (6) and the protruding structure on the lens (8). The encapsulation material forms a layer (9) between the lens and the base component and provides the adhesion between the two parts. This layer extends out until the groove so that the adhesion is enhanced by the larger surface area. In addition, the rough surface texture of the base component i.e. the groove (6) also promotes better adhesion.

The invention claimed is:

1. A method for producing a surface mount optoelectronic component assembly comprising the steps:
   preparing a base component with one or more optoelectronic chips mounted within a cavity;
   filling the cavity with an encapsulation material;
   curing the base component to harden the encapsulation material;
   applying an amount of the same encapsulation material on the top of the base component;
   placing a lens structure on top of the base component and locating the lens structure by a groove formed on the base component and a protruding structure formed on the lens structure; and
   curing the whole assembly to bond the lens and base component together.

2. A method according to claim 1, wherein heat is used to cure the final assembly so that the lens is bonded to the base component.

3. A method according to claim 2, wherein silicone is used as the bonding material between the lens and the base component.

* * * * *